(12) United States Patent
Aisenbrey

(10) Patent No.: US 8,377,585 B2
(45) Date of Patent: Feb. 19, 2013

(54) LOW COST ELECTRICAL TERMINALS MANUFACTURED FROM CONDUCTIVE LOADED RESIN-BASED MATERIALS

(75) Inventor: Thomas Aisenbrey, Littleton, CO (US)

(73) Assignee: Integral Technologies, Inc., Bellingham, WA (US)

( * ) Notice: Subject to any disclaimer, the term of this patent is extended or adjusted under 35 U.S.C. 154(b) by 491 days.

(21) Appl. No.: 12/798,898

(22) Filed: Apr. 13, 2010

(65) Prior Publication Data

US 2010/0192361 A1 Aug. 5, 2010

Related U.S. Application Data

(60) Division of application No. 11/053,562, filed on Feb. 8, 2005, now Pat. No. 7,759,002, and a continuation-in-part of application No. 10/309,429, filed on Dec. 4, 2002, now Pat. No. 6,870,516, which is a continuation-in-part of application No. 10/075,778, filed on Feb. 14, 2002, now Pat. No. 6,741,221.

(60) Provisional application No. 60/317,808, filed on Sep. 7, 2001, provisional application No. 60/269,414, filed on Feb. 16, 2001, provisional application No. 60/268,822, filed on Feb. 15, 2001, provisional application No. 60/549,571, filed on Mar. 3, 2004.

(51) Int. Cl.
*H01M 2/02* (2006.01)

(52) U.S. Cl. ........................... 429/177; 429/178

(58) Field of Classification Search .................. 343/702; 429/177, 178, 179
See application file for complete search history.

(56) References Cited

U.S. PATENT DOCUMENTS

| | | | |
|---|---|---|---|
| 3,671,323 A * | 6/1972 | Sandler | 429/524 |
| 4,098,967 A | 7/1978 | Biddick | |
| 5,190,833 A * | 3/1993 | Goldstein et al. | 429/406 |
| 5,685,632 A | 11/1997 | Schaller | |
| 5,716,243 A | 2/1998 | Kourimsky | |
| 5,771,027 A | 6/1998 | Marks | |
| 6,147,662 A | 11/2000 | Grabau | |
| 6,249,261 B1 | 6/2001 | Solberg | |
| 6,342,680 B1 | 1/2002 | Nakagawa | |
| 6,468,692 B1 * | 10/2002 | Nemoto et al. | 429/174 |
| 8,092,937 B2 * | 1/2012 | Hatta et al. | 429/177 |
| 2009/0029245 A1 * | 1/2009 | Ibaragi et al. | 429/176 |

FOREIGN PATENT DOCUMENTS

| | | |
|---|---|---|
| DE | 4227208 | 2/1994 |
| EP | 0862240 | 9/1998 |
| EP | 1024552 | 1/2000 |
| JP | 06188629 | 12/1994 |
| JP | 07162220 | 6/1995 |

* cited by examiner

*Primary Examiner* — Tho G Phan
(74) *Attorney, Agent, or Firm* — Matthew P. Frederick; Reed Smith LLP

(57) ABSTRACT

Electrical terminals are formed of a conductive loaded resin-based material. The conductive loaded resin-based material comprises micron conductive powder(s), conductive fiber(s), or a combination of conductive powder and conductive fibers in a base resin host. The percentage by weight of the conductive powder(s), conductive fiber(s), or a combination thereof is between about 20% and 50% of the weight of the conductive loaded resin-based material. The micron conductive powders are formed from non-metals, such as carbon, graphite, that may also be metallic plated, or the like, or from metals such as stainless steel, nickel, copper, silver, that may also be metallic plated, or the like, or from a combination of non-metal, plated, or in combination with, metal powders. The micron conductor fibers preferably are of nickel plated carbon fiber, stainless steel fiber, copper fiber, silver fiber, aluminum fiber, or the like.

14 Claims, 7 Drawing Sheets

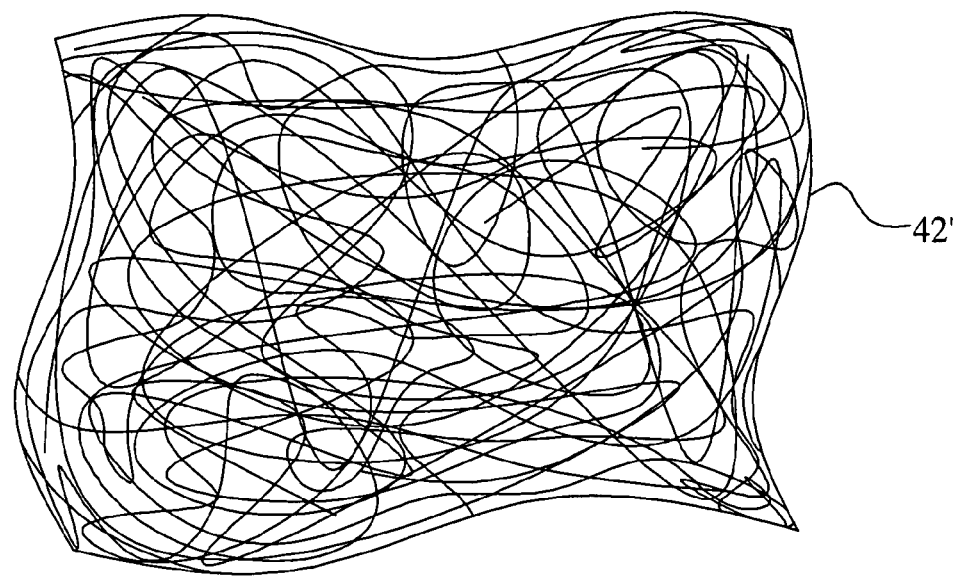
FIG. 5b
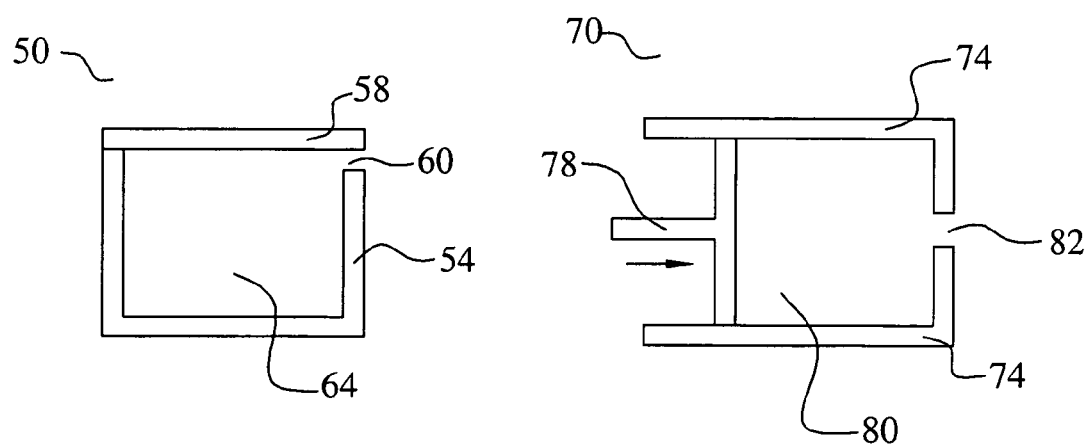
FIG. 6a
FIG. 6b

LOW COST ELECTRICAL TERMINALS MANUFACTURED FROM CONDUCTIVE LOADED RESIN-BASED MATERIALS

RELATED APPLICATIONS

This application is a division of U.S. patent application Ser. No. 11/053,562, filed on Feb. 8, 2005, and assigned to the same assignee as the present invention, which issued on Jul. 20, 2010 as U.S. Pat. No. 7,759,002, which is incorporated by reference in its entirety. This divisional patent application claims priority to the U.S. Provisional Patent Application 60/549,571 filed on Mar. 3, 2004, which is herein incorporated by reference in its entirety.

This Patent Application is a Continuation-in-Part of U.S. patent application Ser. No. 10/309,429, filed on Dec. 4, 2002, now issued as U.S. Pat. No. 6,870,516, also incorporated by reference in its entirety, which is a Continuation-in-Part application of U.S. patent application Ser. No. 10/075,778, filed on Feb. 14, 2002, now issued as U.S. Pat. No. 6,741,221, which claimed priority to U.S. Provisional Patent Applications Ser. No. 60/317,808, filed on Sep. 7, 2001, Ser. No. 60/269,414, filed Feb. 16, 2001, and Ser. No. 60/268,822, filed on Feb. 15, 2001.

BACKGROUND OF THE INVENTION (1) Field of the Invention

This invention relates to electrical devices and, more particularly, to battery terminals and electrical conductors molded of conductive loaded resin-based materials comprising micron conductive powders, micron conductive fibers, or a combination thereof, substantially homogenized within a base resin when molded. This manufacturing process yields a conductive part or material usable within the EMF or electronic spectrum(s).

(2) Description of the Prior Art

Portable electrical and electronic devices are widely used in industrial and consumer applications. A common feature in most of these portable devices is a battery power source. Battery power sources comprise a means of storing energy in chemical form and releasing this energy as electrical power upon demand from the portable device. In a typical battery source, a set of dissimilar elemental electrodes are held in an electrolyte. When an electrical demand is placed across the electrodes, an internal electrochemical reaction occurs between the electrodes and the electrolyte. This electrochemical reaction generates free electrons at a voltage potential as a by-product.

In most cases, it is assumed that the battery, even if it is rechargeable, is a replaceable component of the portable electrical or electronics system. Therefore, the battery must be designed for handling and for replacement. In many cases, the electrode materials that are used in the electrochemical reaction are not appropriate for external use because the material is expensive, hazardous, and/or does not have optimal properties of hardness or electrical conductivity. For example, lead may serve as an electrode material in a lead-acid battery as is commonly found in motor vehicle applications. However, it is common for the external terminals, or contact terminals, of a lead-acid battery to be constructed of another metal material or of a metal alloy that exhibits better conductivity than lead while reducing the hazardous properties of lead exposure. Similarly, in various portable batteries, the external contact points for the battery are typically formed of very conductive metals or alloys that contact the internal electrode materials either directly or via a conductive paste.

A typical problem for various types of batteries is that of corrosion. The corrosive chemical conditions that cause reactions to occur at the internal electrodes also present a corrosive environment for the external electrodes. In addition, external environmental conditions of portable operation tend to increase corrosive. In a motor vehicle, for example, external conditions of moisture, road and sea salt, and vehicle fluids, combine with the inherent voltage conditions to cause rapid electro-voltaic corrosion of the battery electrodes and cables. Corrosion of these components causes many reliability concerns. A key objective of the present invention is to provide external battery terminals, contacts, and conductors combining excellent electrical performance with excellent corrosion resistance.

Several prior art inventions relate to battery applications and to conductive plastics. U.S. Pat. No. 5,685,632 to Schaller et al describes a flashlight wherein structural components comprise conductive plastic such that these structural components complete the lighting circuit. The conductive plastic may comprises a resin material with metal filler. U.S. Pat. No. 5,716,243 to Kourimsky teaches a connector assembly used to connect to terminals of an automotive battery. U.S. Pat. No. 4,098,967 to Biddick et al describes a lead-acid type battery. Conductive plastic is used in each cell to form a protective layer between active elements. Metal (Pb) sheets are bonded to the conductive plastic on the end cells to form terminal connections. The conductive plastic uses carbon fiber. U.S. Pat. No. 6,342,680 to Nakagawa et al teaches a lead-free, super-highly conductive plastic formed from a conductive resin composition. The conductive resin comprises a thermoplastic resin, a lead-free solder that melts during plasticization, and metal powder or a mixture of metal powder and metal short fibers.

SUMMARY OF THE INVENTION

A principal object of the present invention is to provide effective electrical terminals.

A further object of the present invention is to provide effective battery terminals.

A further object of the present invention is to provide effective battery cables.

A further object of the present invention is to provide a method to form electrical terminals.

A further object of the present invention is to provide a method to form battery terminals.

A further object of the present invention is to provide a method to form battery cables.

A further object of the present invention is to provide electrical terminals molded of conductive loaded resin-based materials.

A yet further object of the present invention is to provide electrical terminals molded of conductive loaded resin-based material where characteristics of the electrical terminals can be altered by forming a metal layer over the conductive loaded resin-based material.

A yet further object of the present invention is to provide methods to fabricate electrical terminals from a conductive loaded resin-based material incorporating various forms of the material.

A yet further object of the present invention is to provide a method to fabricate electrical terminals from a conductive loaded resin-based material where the material is in the form of a fabric.

A yet further object of the present invention is to provide electrical terminals having excellent electrical conductivity and excellent resistance to corrosion.

In accordance with the objects of this invention, a battery device is achieved. The device comprises a battery storage cell having first and second internal electrodes. A first external terminal is connected to the first internal electrode. A second external terminal is connected to the second internal electrode. At least one of the external terminals comprises a conductive loaded, resin-based material comprising conductive materials in a base resin host.

Also in accordance with the objects of this invention, a battery device is achieved. The device comprises a battery storage cell having first and second internal electrodes. A first external terminal is connected to the first internal electrode. A second external terminal is connected to the second internal electrode. At least one of the external terminals comprises a conductive loaded, resin-based material comprising conductive materials in a base resin host. The percent by weight of the conductive materials is between about 20% and about 40% of the total weight of the conductive loaded resin-based material.

Also in accordance with the objects of this invention, a method to form a battery device is achieved. The method comprises providing a battery storage cell having first and second internal electrodes. A conductive loaded, resin-based material comprising conductive materials in a resin-based host is provided. The conductive loaded, resin-based material is molded into an external terminal. The external terminal is connected to one of the internal electrodes.

BRIEF DESCRIPTION OF THE DRAWINGS

In the accompanying drawings forming a material part of this description, there is shown:

FIGS. 5a and 5b illustrate a fourth preferred embodiment wherein conductive fabric-like materials are formed from the conductive loaded resin-based material.

FIGS. 6a and 6b illustrate, in simplified schematic form, an injection molding apparatus and an extrusion molding apparatus that may be used to mold electrical terminals of a conductive loaded resin-based material.

DESCRIPTION OF THE PREFERRED EMBODIMENTS

Figure 1:
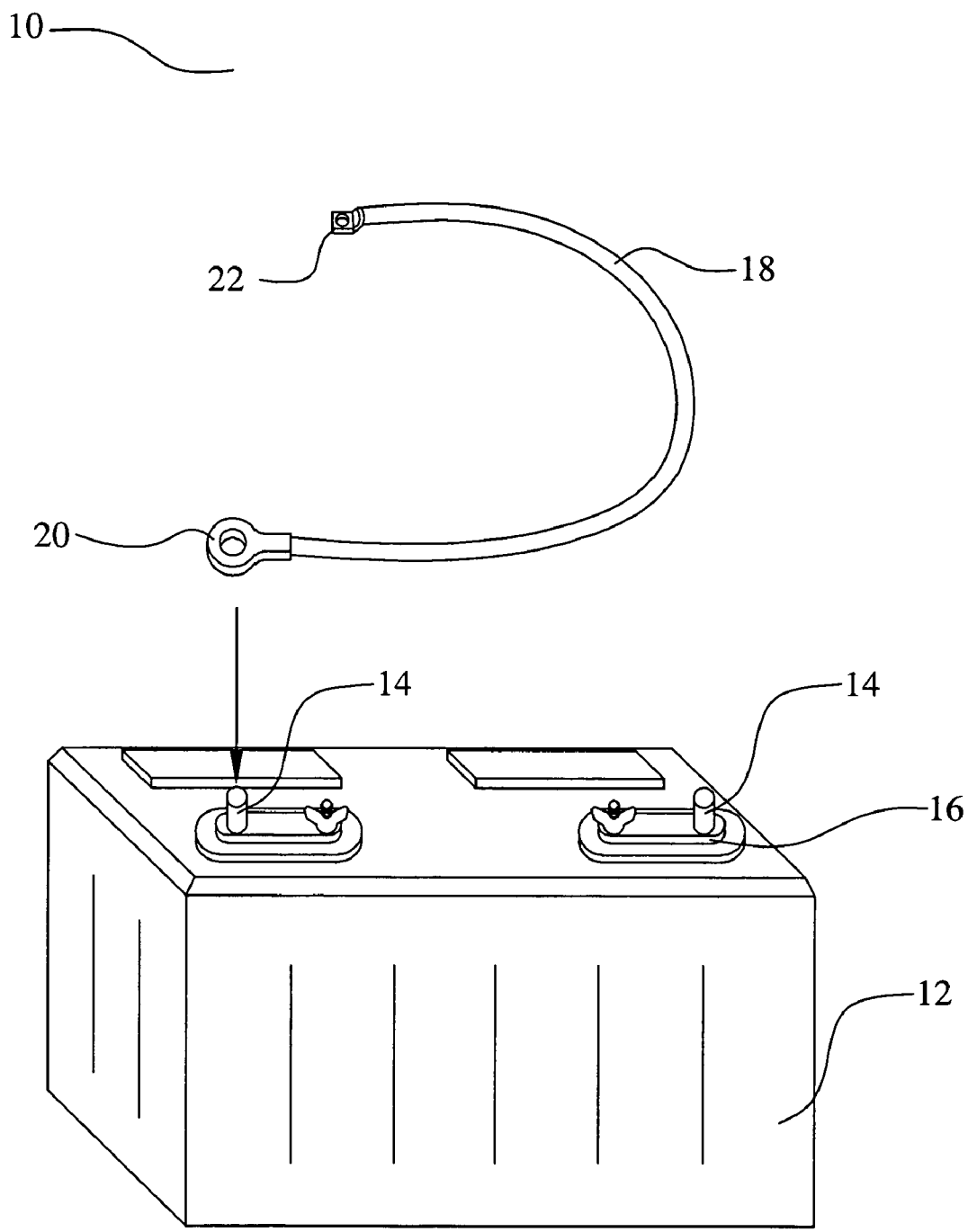
FIG. 1 illustrates a first preferred embodiment of the present invention showing electrical terminals formed of conductive loaded resin-based material and, more particularly, showing preferred embodiments of battery terminals and battery cable terminals or lugs.

This invention relates to electrical terminals molded of conductive loaded resin-based materials comprising micron conductive powders, micron conductive fibers, or a combination thereof, substantially homogenized within a base resin when molded.

The conductive loaded resin-based materials of the invention are base resins loaded with conductive materials, which then makes any base resin a conductor rather than an insulator. The resins provide the structural integrity to the molded part. The micron conductive fibers, micron conductive powders, or a combination thereof, are substantially homogenized within the resin during the molding process, providing the electrical continuity.

The conductive loaded resin-based materials can be molded, extruded or the like to provide almost any desired shape or size. The molded conductive loaded resin-based materials can also be cut, stamped, or vacuumed formed from an injection molded or extruded sheet or bar stock, over-molded, laminated, milled or the like to provide the desired shape and size. The thermal or electrical conductivity characteristics of electrical terminals fabricated using conductive loaded resin-based materials depend on the composition of the conductive loaded resin-based materials, of which the loading or doping parameters can be adjusted, to aid in achieving the desired structural, electrical or other physical characteristics of the material. The selected materials used to fabricate the electrical terminals are substantially homogenized together using molding techniques and or methods such as injection molding, over-molding, insert molding, thermo-set, protrusion, extrusion or the like. Characteristics related to 2D, 3D, 4D, and 5D designs, molding and electrical characteristics, include the physical and electrical advantages that can be achieved during the molding process of the actual parts and the polymer physics associated within the conductive networks within the molded part(s) or formed material(s).

The use of conductive loaded resin-based materials in the fabrication of electrical terminals significantly lowers the cost of materials and the design and manufacturing processes used to hold ease of close tolerances, by forming these materials into desired shapes and sizes. The electrical terminals can be manufactured into infinite shapes and sizes using conventional forming methods such as injection molding, over-molding, or extrusion or the like. The conductive loaded resin-based materials, when molded, typically but not exclusively produce a desirable usable range of resistivity from between about 5 and 25 ohms per square, but other resistivities can be achieved by varying the doping parameters and/or resin selection(s).

The conductive loaded resin-based materials comprise micron conductive powders, micron conductive fibers, or any combination thereof, which are substantially homogenized together within the base resin, during the molding process, yielding an easy to produce low cost, electrically conductive, close tolerance manufactured part or circuit. The resulting molded article comprises a three dimensional, continuous network of conductive loading and polymer matrix. The micron conductive powders can be of carbons, graphites, amines or the like, and/or of metal powders such as nickel, copper, silver, aluminum, or plated or the like. The use of carbons or other forms of powders such as graphite(s) etc. can create additional low level electron exchange and, when used in combination with micron conductive fibers, creates a micron filler element within the micron conductive network of fiber(s) producing further electrical conductivity as well as acting as a lubricant for the molding equipment. The micron conductive fibers can be nickel plated carbon fiber, stainless steel fiber, copper fiber, silver fiber, aluminum fiber, or the like, or combinations thereof. The structural material is a material such as any polymer resin. Structural material can be, here given as examples and not as an exhaustive list, polymer resins produced by GE PLASTICS, Pittsfield, Mass., a range of other plastics produced by GE PLASTICS, Pittsfield, Mass., a range of other plastics produced by other manufacturers, silicones produced by GE SILICONES, Waterford, N.Y., or other flexible resin-based rubber compounds produced by other manufacturers.

The resin-based structural material loaded with micron conductive powders, micron conductive fibers, or in combination thereof can be molded, using conventional molding methods such as injection molding or over-molding, or extrusion to create desired shapes and sizes. The molded conductive loaded resin-based materials can also be stamped, cut or milled as desired to form create the desired shape form factor(s) of the electrical terminals. The doping composition and directionality associated with the micron conductors within the loaded base resins can affect the electrical and structural characteristics of the electrical terminals and can be precisely controlled by mold designs, gating and or protrusion design(s) and or during the molding process itself. In addition, the resin base can be selected to obtain the desired thermal characteristics such as very high melting point or specific thermal conductivity.

A resin-based sandwich laminate could also be fabricated with random or continuous webbed micron stainless steel fibers or other conductive fibers, forming a cloth like material. The webbed conductive fiber can be laminated or the like to materials such as Teflon, Polyesters, or any resin-based flexible or solid material(s), which when discretely designed in fiber content(s), orientation(s) and shape(s), will produce a very highly conductive flexible cloth-like material. Such a cloth-like material could also be used in forming electrical terminals that could be embedded in a person's clothing as well as other resin materials such as rubber(s) or plastic(s). When using conductive fibers as a webbed conductor as part of a laminate or cloth-like material, the fibers may have diameters of between about 3 and 12 microns, typically between about 8 and 12 microns or in the range of about 10 microns, with length(s) that can be seamless or overlapping.

The conductive loaded resin-based material of the present invention can be made resistant to corrosion and/or metal electrolysis by selecting micron conductive fiber and/or micron conductive powder and base resin that are resistant to corrosion and/or metal electrolysis. For example, if a corrosion/electrolysis resistant base resin is combined with stainless steel fiber and carbon fiber/powder, then a corrosion and/or metal electrolysis resistant conductive loaded resin-based material is achieved. Another additional and important feature of the present invention is that the conductive loaded resin-based material of the present invention may be made flame retardant. Selection of a flame-retardant (FR) base resin material allows the resulting product to exhibit flame retardant capability. This is especially important in electrical terminal applications as described herein.

The substantially homogeneous mixing of micron conductive fiber and/or micron conductive powder and base resin described in the present invention may also be described as doping. That is, the substantially homogeneous mixing converts the typically non-conductive base resin material into a conductive material. This process is analogous to the doping process whereby a semiconductor material, such as silicon, can be converted into a conductive material through the introduction of donor/acceptor ions as is well known in the art of semiconductor devices. Therefore, the present invention uses the term doping to mean converting a typically non-conductive base resin material into a conductive material through the substantially homogeneous mixing of micron conductive fiber and/or micron conductive powder into a base resin.

As an additional and important feature of the present invention, the molded conductor loaded resin-based material exhibits excellent thermal dissipation characteristics. Therefore, electrical terminals manufactured from the molded conductor loaded resin-based material can provide added thermal dissipation capabilities to the application. For example, heat can be dissipated from electrical devices physically and/or electrically connected to an electrical terminal of the present invention.

As a significant advantage of the present invention, electrical terminals constructed of the conductive loaded resin-based material can be easily interfaced to an electrical circuit or grounded. In one embodiment, a wire can be attached to a conductive loaded resin-based electrical terminal via a screw that is fastened to the electrical terminal. For example, a simple sheet-metal type, self tapping screw, when fastened to the material, can achieve excellent electrical connectivity via the conductive matrix of the conductive loaded resin-based material. To facilitate this approach a boss may be molded into the conductive loaded resin-based material to accommodate such a screw. Alternatively, if a solderable screw material, such as copper, is used, then a wire can be soldered to the screw that is embedded into the conductive loaded resin-based material. In another embodiment, the conductive loaded resin-based material is partly or completely plated with a metal layer. The metal layer forms excellent electrical conductivity with the conductive matrix. A connection of this metal layer to another circuit or to ground is then made.

A typical metal deposition process for forming a metal layer onto the conductive loaded resin-based material is vacuum metallization. Vacuum metallization is the process where a metal layer, such as aluminum, is deposited on the conductive loaded resin-based material inside a vacuum chamber. In a metallic painting process, metal particles, such as silver, copper, or nickel, or the like, are dispersed in an acrylic, vinyl, epoxy, or urethane binder. Most resin-based materials accept and hold paint well, and automatic spraying systems apply coating with consistency. In addition, the excellent conductivity of the conductive loaded resin-based material of the present invention facilitates the use of extremely efficient, electrostatic painting techniques.

The conductive loaded resin-based material can be contacted in any of several ways. In one embodiment, a pin is embedded into the conductive loaded resin-based material by insert molding, ultrasonic welding, pressing, or other means. A connection with a metal wire can easily be made to this pin and results in excellent contact to the conductive loaded resin-based material. In another embodiment, a hole is formed in to the conductive loaded resin-based material either during the molding process or by a subsequent process step such as drilling, punching, or the like. A pin is then placed into the hole and is then ultrasonically welded to form a permanent mechanical and electrical contact. In yet another embodiment, a pin or a wire is soldered to the conductive loaded resin-based material. In this case, a hole is formed in the conductive loaded resin-based material either during the molding operation or by drilling, stamping, punching, or the like. A solderable layer is then formed in the hole. The solderable layer is preferably formed by metal plating. A conductor is placed into the hole and then mechanically and electrically bonded by point, wave, or reflow soldering.

Another method to provide connectivity to the conductive loaded resin-based material is through the application of a solderable ink film to the surface. One exemplary solderable ink is a combination of copper and solder particles in an epoxy resin binder. The resulting mixture is an active, screen-printable and dispensable material. During curing, the solder reflows to coat and to connect the copper particles and to thereby form a cured surface that is directly solderable without the need for additional plating or other processing steps. Any solderable material may then be mechanically and/or electrically attached, via soldering, to the conductive loaded resin-based material at the location of the applied solderable ink. Many other types of solderable inks can be used to provide this solderable surface onto the conductive loaded resin-based material of the present invention. Another exemplary embodiment of a solderable ink is a mixture of one or more metal powder systems with a reactive organic medium. This type of ink material is converted to solderable pure metal during a low temperature cure without any organic binders or alloying elements.

Referring now to FIG. 1, a first preferred embodiment of the present invention is illustrated. Very low cost battery terminals 14 and cable terminals 20 are shown. Several important features of the present invention are shown and discussed below. The first preferred embodiment 10 of the present invention shows a battery 12 and a battery cable 18. In the present invention, battery terminals 14 are formed of conductive loaded resin-based material to achieve excellent conductivity, resistance to corrosion, and ease of manufacture. Any industry standard type of battery 12 may be fitted with the battery terminals 14 of the present invention. Single cell, multiple cell, lead-acid, gel-cell, alkaline, nickel-metal-hydride, lithium-ion, or the like, battery types, as are common to everyday applications, are all easily fitted with a conductive loaded resin-based material battery terminal.

In the illustrated embodiment of FIG. 1, a lead-acid, wet cell type of battery, as is common to motor vehicle and recreational vehicle applications, is shown. The battery 12 comprises terminals 14 and 16 for connection to the using interface. In the prior art, these terminals 14 and 16 typically comprise a metal such as lead or lead and iron. In the present invention, however, the terminal posts 14, the terminal blocks 16, or both the terminal posts 14 and blocks 16 are formed from a conductive loaded resin-based material. By forming the terminals 14 and/or terminal blocks 16 from a conductive loaded resin-based material, the present invention improves the battery by reducing material costs, corrosiveness, and manufacturing steps. By comparison, corrosion of metal terminals is a serious concern that reduces the lifetime and the electrical contact performance of prior art batteries.

The terminal posts 14 and blocks 16 are easily formed by molding the conductive loaded resin-based material. In one embodiment, the terminal posts 14 and blocks 16 are over-molded onto the inner electrodes of the battery 12. In another embodiment, the terminal posts 14 and blocks 16 are first molded and then press fitted onto the inner electrodes. In another embodiment, the conductive loaded resin-based material terminal posts 14 and blocks 16 are first molded and then are coated or plated with a metal layer or with a conductive paint as is described above. In one embodiment, this metal layer or conductive paint is applied to the inside of the molded terminal 14 and is used to improve the electrical mating between the molded terminal 14 and the inner electrode of the battery 12. In another embodiment, this metal layer or conductive paint is applied to the outside of the terminal 14 and post 16 and is used to alter the appearance or to provide an improved electrical mating between the molded terminal 14 and the connector terminal 20. In another embodiment of the present invention, the battery terminal posts 14 and blocks 16 are made non-corrosive by forming the conductive loaded resin-based material of a non-corrosive loading, such as stainless steel fiber.

In addition to battery terminals 14 and terminal blocks 16, battery cables 18 and terminals 20 and 22 may be formed using conductive loaded resin-based materials according to the present invention. In one embodiment, battery 12 cable connectors 20 and 22, such as the battery end connector 20 or the electrical system end connector 22, are formed from the conductive loaded resin-based materials. In one embodiment, the cable connectors 20 and 22 are over-molded onto the inner conductor of the battery cable 18. In another embodiment, the cable connectors 20 and 22 are first molded and then press fitted onto the inner conductor of the battery cable 18. In another embodiment, the conductive loaded resin-based material cable connectors 20 and 22 are first molded and then are coated or plated with a metal layer or with a conductive paint as is described above. In one embodiment, this metal layer or conductive paint is applied to the inside of the molded cable connectors 20 and 22 and is used to improve the electrical mating between the molded cable connectors 20 and 22 and the inner conductor of the battery cable 18. In another embodiment, this metal layer or conducive paint is applied to the outside of the cable connectors 20 and 22 and is used to alter the appearance or to provide an improved electrical mating between the molded cable connectors 20 and 22 and the battery terminals 14 or system connections, not shown. In another embodiment of the present invention, the cable connectors 20 and 22 are made non-corrosive by forming the conductive loaded resin-based material of a non-corrosive loading, such as stainless steel fiber.

According to another embodiment of the present invention, the cable conductor 18 is formed from the conductive loaded resin-based material. In this case, an insulating material must be formed on the outside of the cable conductor 18 to prevent short circuiting of the electrical system and to allow the cable conductor 18 to be handled and/or to be routed. By forming the cable connectors 20 and 22 and/or the conductor 18 from a conductive resin-based material, the present invention improves the battery cable by reducing the material costs and the manufacturing steps. In addition, the conductive loaded resin-based battery cable connectors 20 and 22 and/or conductors 18 are non-corrosive. By comparison, corrosion of metal terminals is a serious concern that reduces the lifetime, the electrical contact and the performance of prior art battery cables. In a preferred embodiment, a conductive loaded resin-based core conductor is formed by extrusion, and an outer insulating layer is co-extruded around the core conductor.

Figure 7:
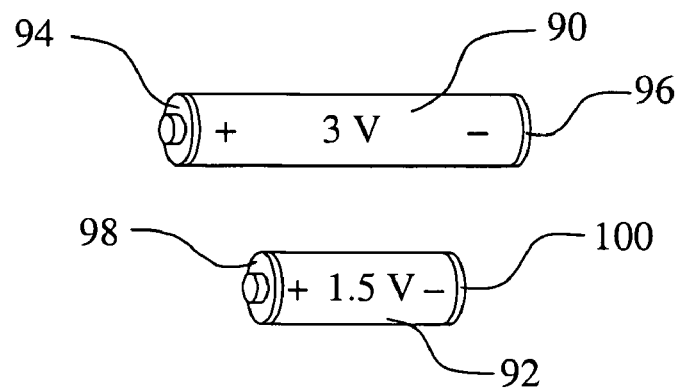
FIG. 7 illustrates a second preferred embodiment of the present invention showing two dry cell batteries having terminals molded of conductive loaded resin-based material.

Referring now to FIG. 7, a second preferred embodiment of the present invention is the illustrated. In this embodiment, two dry cell batteries 90 and 92, such as are used in household applications, are shown. Terminals 94, 96, 98, and 100 for these batteries 90 and 92 are formed from the conductive loaded resin-based material. The conductive loaded resin-based battery terminal may be further applied to any type of battery, such as, but not limited to, zinc-carbon batteries, alkaline batteries, lithium photo batteries, lead-acid batteries, nickel-cadmium batteries, nickel-metal hydride batteries, lithium ion batteries, zinc-air batteries, zinc-mercury batteries, silver-zinc batteries, and metal chloride batteries. The formation of battery terminals from the conductive loaded resin-based materials reduces battery material cost, part counts, manufacturing costs, and weight as well as eliminating corrosion and oxidation problems found in the prior art.

The outer terminals 94, 96, 98, and 100 are easily formed by molding the conductive loaded resin-based material. In one embodiment, the outer terminals 94, 96, 98, and 100 are over-molded onto the inner electrodes of the battery 90 and 92. In another embodiment, the outer terminals 94, 96, 98, and 100 are first molded and then press fitted onto the inner electrodes. In another embodiment, the conductive loaded resin-based material outer terminals 94, 96, 98, and 100 are first molded and then are coated or plated with a metal layer or with a conductive paint as is described above. In one embodiment, this metal layer or conductive paint is applied to the insides of the molded outer terminals 94, 96, 98, and 100 and is used to improve the electrical mating between the molded outer terminals 94, 96, 98, and 100 and the inner electrodes of the battery 90 and 92. In another embodiment, this metal layer or conducive paint is applied to the outside of the outer terminals 94, 96, 98, and 100 and is used to alter the appearance or to provide an improved electrical mating between the molded outer terminals 94, 96, 98, and 100 and the system battery connectors, not shown. In another embodiment of the present invention, the battery outer terminals 94, 96, 98, and 100 are made non-corrosive by forming the conductive loaded resin-based material of a non-corrosive loading, such as stainless steel fiber.

Figure 8A:
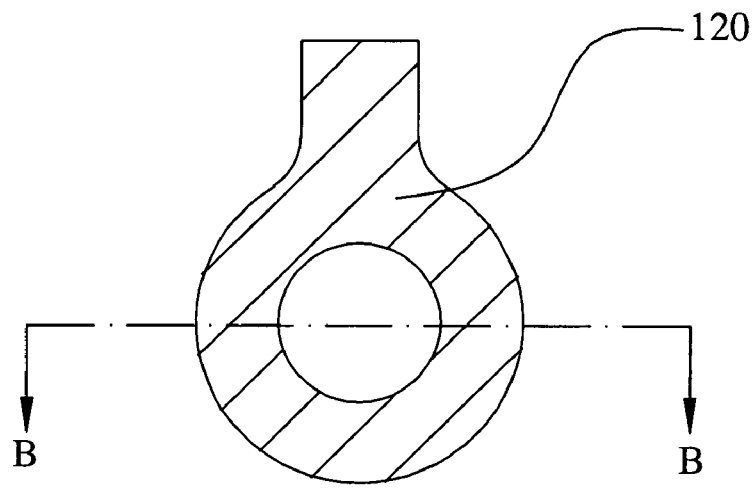
FIGS. 8a and 8b illustrates a third preferred embodiment of the present invention showing an electrical terminal according to the present invention and further showing the formation of a metal layer over the conductive loaded resin-based material to thereby alter the appearance characteristics or the electrical characteristics of the terminal.
Figure 8B:
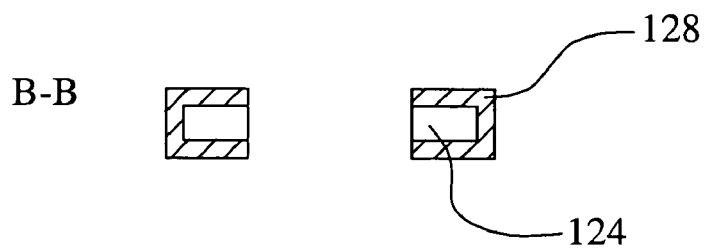

Referring now to FIGS. 8a and 8b another preferred embodiment of the present invention is illustrated. An electrical terminal 120 is shown. In this embodiment, an electrical terminal 120 is formed by, first, molding an inner core 120 of the conductive loaded resin-based material of the present invention. Next, a metal layer, or conductive paint 128, is formed over the molded conductive loaded resin-based terminal 124. The metal layer, or conductive paint 128, may be applied to alter the appearance characteristics and/or the electrical characteristics of the terminal. If a metal layer 128 is used, this layer may be formed by plating or by coating. If the method of formation is metal plating, then the resin-based structural material of the conductive loaded, resin-based material should comprise a resin-based material that can be metal plated. There are very many of the polymer resins that can be plated with metal layers. For example, GE Plastics, SUPEC, VALOX, ULTEM, CYCOLAC, UGIKRAL, STYRON, CYCOLOY are a few resin-based materials that can be metal plated. The metal layer 120 may be formed by, for example, electroplating or physical vapor deposition. If conductive paint 128 is used, this layer is formed by coating, dipping, or spraying.

Figure 9:
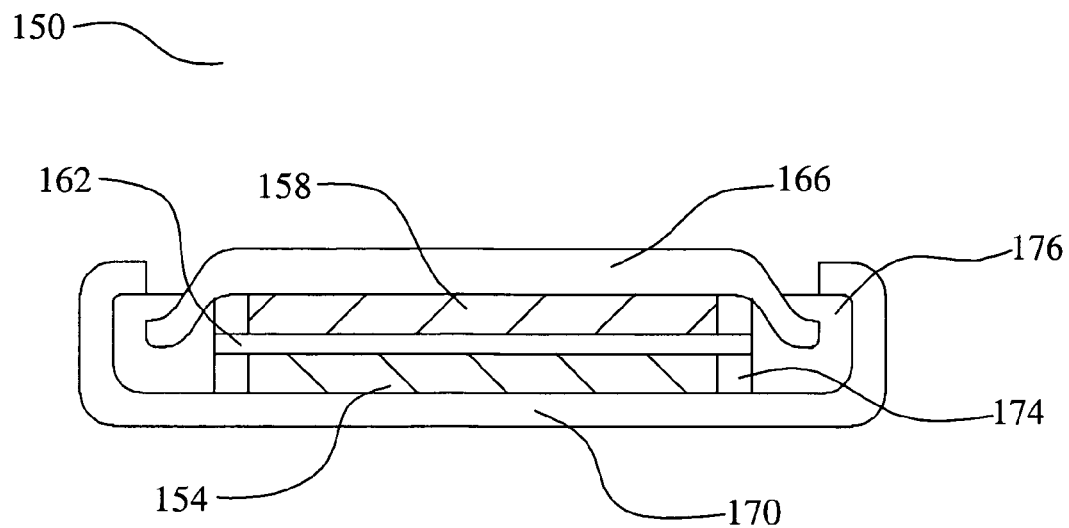
FIG. 9 illustrates a third preferred embodiment of the present invention showing a button type battery having terminals molded of conductive loaded resin-based material.

Referring now to FIG. 9, a third preferred embodiment of the present invention is illustrated. In this embodiment, a button type battery 150 is shown. Button type batteries are frequently used is applications, such as watches and hearing aids, where the battery must fit into a small package. The button battery 150 comprises a positive inner electrode 154 and negative inner electrode 158, each comprising dissimilar materials and separated by a barrier 162. An electrolyte surrounds the electrodes 154 and 158. A gasket 176 seals the electrolyte 174 into the battery 150. As important features of the present invention, the positive terminal 170 and the negative terminal 166 comprise the conductive loaded resin-based material of the present invention.

The positive and negative terminals 170 and 166 are easily formed by molding the conductive loaded resin-based material. In one embodiment, the positive and negative terminals 170 and 166 are over-molded onto the inner electrodes of the battery 154 and 158. In another embodiment, the positive and negative terminals 170 and 166 are first molded and then press fitted onto the battery assembly 150. In another embodiment, the conductive loaded resin-based material positive and negative terminals 170 and 166 are first molded and then are coated or plated with a metal layer or with a conductive paint as is described above. In one embodiment, this metal layer or conductive paint is applied to the insides of the molded positive and negative terminals 170 and 166 and is used to improve the electrical mating between the molded positive and negative terminals 170 and 166 and the inner electrodes of the battery 154 and 158. In another embodiment, this metal layer or conducive paint is applied to the outside of the positive and negative terminals 170 and 166 and is used to alter the appearance or to provide an improved electrical mating between the molded positive and negative terminals 170 and 166 and the system battery connectors, not shown. In another embodiment of the present invention, the battery positive and negative terminals 170 and 166 are made non-corrosive by forming the conductive loaded resin-based material of a non-corrosive loading, such as stainless steel fiber.

Figure 10:
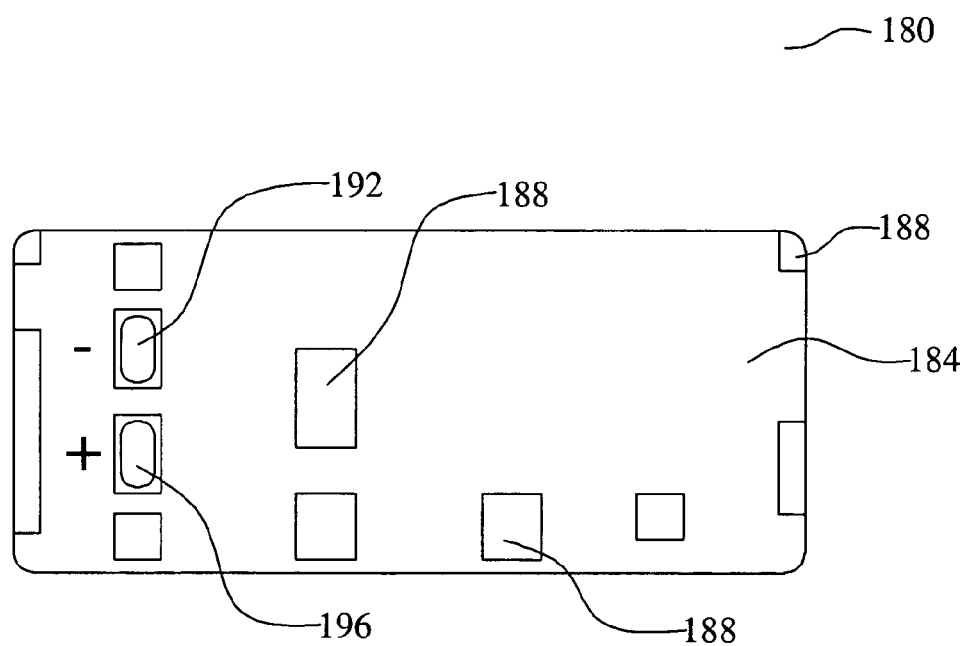
FIG. 10 illustrates a fourth preferred embodiment of the present invention showing a rechargeable battery 180 having terminals molded of conductive loaded resin-based material.

Referring now to FIG. 10, a fourth preferred embodiment of the present invention is illustrated. In this embodiment, a rechargeable battery 180 is shown. Rechargeable batteries are frequently used is applications, such as camcorders and power tools, where the battery must supply substantial power such that a recharging capability is needed. The rechargeable battery 180 is shown in top, or terminal, view. The battery 180 comprises an insulating case 184 typically comprising a resin-based material. Various slots 188 are molded into the case 184 to insure that battery is only inserted into the charging base, not shown, or the operating appliance, not shown, in the proper polarity. As important features of the present invention, the positive terminal 196 and the negative terminal 192 comprise the conductive loaded resin-based material of the present invention.

The positive and negative terminals 196 and 192 are easily formed by molding the conductive loaded resin-based material. In one embodiment, the positive and negative terminals 196 and 192 are over-molded onto the inner electrodes of the battery 180. In another embodiment, the positive and negative terminals 196 and 192 are first molded and then press fitted onto the battery assembly 184. In another embodiment, the positive and negative terminals 196 and 192 are first molded, and then the case 184 is over-molded onto the terminals 196 and 192. In another embodiment, the conductive loaded resin-based material positive and negative terminals 196 and 192 are first molded and then are coated or plated with a metal layer or with a conductive paint as is described above. In one embodiment, this metal layer or conductive paint is applied to the insides of the molded positive and negative terminals 196 and 192 and is used to improve the electrical mating between the molded positive and negative terminals 196 and 192 and the inner electrodes of the battery. In another embodiment, this metal layer or conducive paint is applied to the outside of the positive and negative terminals 196 and 192 and is used to alter the appearance or to provide an improved electrical mating between the molded positive and negative terminals 196 and 192 and the charging station or the appliance battery connectors, not shown. In another embodiment of the present invention, the battery positive and negative terminals 196 and 192 are made non-corrosive by forming the conductive loaded resin-based material of a non-corrosive loading, such as stainless steel fiber.

Figure 11:
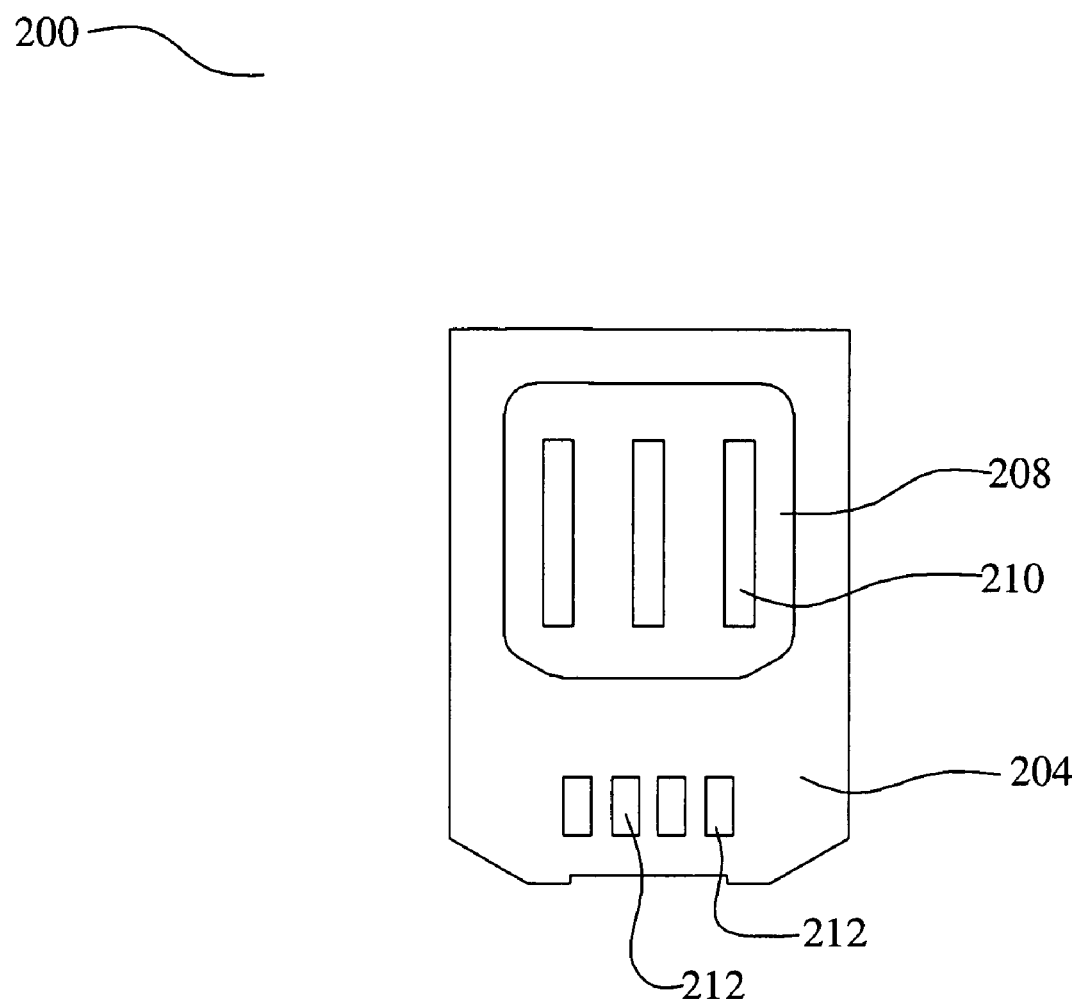
FIG. 11 illustrates a fifth preferred embodiment of the present invention showing a rechargeable battery for a cellular phone having terminal molded of conductive loaded resin-based material and having a heat and/or gas dissipating membrane comprising conductive loaded resin-based material.

Referring now to FIG. 11, a fifth preferred embodiment of the present invention is illustrated. In this embodiment, a rechargeable battery 200 for a cellular phone is shown. The rechargeable battery 200 is again shown in top, or terminal, view. The battery 200 comprises an insulating case 204 typically comprising a resin-based material. As first important features of the present invention, electrical terminals 212 comprise the conductive loaded resin-based material of the present invention.

The terminals 212 are easily formed by molding the conductive loaded resin-based material. In one embodiment, the terminals 212 are over-molded onto the inner electrodes of the battery 200. In another embodiment, the terminals 212 are first molded and then press fitted onto the battery assembly 204. In another embodiment, the terminals 212 are first molded, and then the case 204 is over-molded onto the terminals 212. In another embodiment, the conductive loaded resin-based material positive terminals 212 are first molded and then are coated or plated with a metal layer or with a conductive paint as is described above. In one embodiment, this metal layer or conductive paint is applied to the insides of the molded terminals and is used to improve the electrical mating between the molded terminals 212 and the inner electrodes of the battery. In another embodiment, this metal layer or conducive paint is applied to the outside of the terminals 212 and is used to alter the appearance or to provide an improved electrical mating between the molded terminals 212 and the charging station or the appliance battery connectors, not shown. In another embodiment of the present invention, the battery terminals 212 are made non-corrosive by forming the conductive loaded resin-based material of a non-corrosive loading, such as stainless steel fiber.

As another important embodiment of the present invention, a heat sink 208 and 210 is formed of the conductive loaded resin-based material. In a typical rechargeable battery, significant heat is generated during charging/discharging. This heat can create an overheating situation that reduces battery life, affects the cellular phone performance, or may even result in a catastrophic failure. To dissipate this heat, a conductive loaded resin-based material heat sink 208 and 210 is formed into the case 204 of the battery 200. The conductive loaded resin-based material has excellent capability for dissipating thermal energy due to the high thermal conductivity of the material. According to another embodiment of the present invention, to further enhance the effectiveness of the conductive loaded resin-based material heat sink 208 and 210, fins 210 or other surface area and/or convection enhancing structures are molded into the heat sink 208.

As yet another important embodiment of the present invention, the conductive loaded resin-based material heat sink 208 and 210 further comprises a base resin material that is permeable to reaction gases in the battery cell 200. For example, hydrogen gas is frequently generated as a byproduct of charging/discharging reactions within the battery cell. By selecting a base resin for the heat sink 208 and 210 that forms a polymeric matrix that is permeable to hydrogen gas, the heat sink 208 acts as a venting mechanism to prevent a potentially hazardous build-up of the gas. As another preferred embodiment of the present invention, the conductive loaded resin-based material heat sink 208 and 210 comprises a flexible base resin material such that gas build-up is vented at interfaces between the heat sink 208 and 210 and the case 204.

Figure 2:
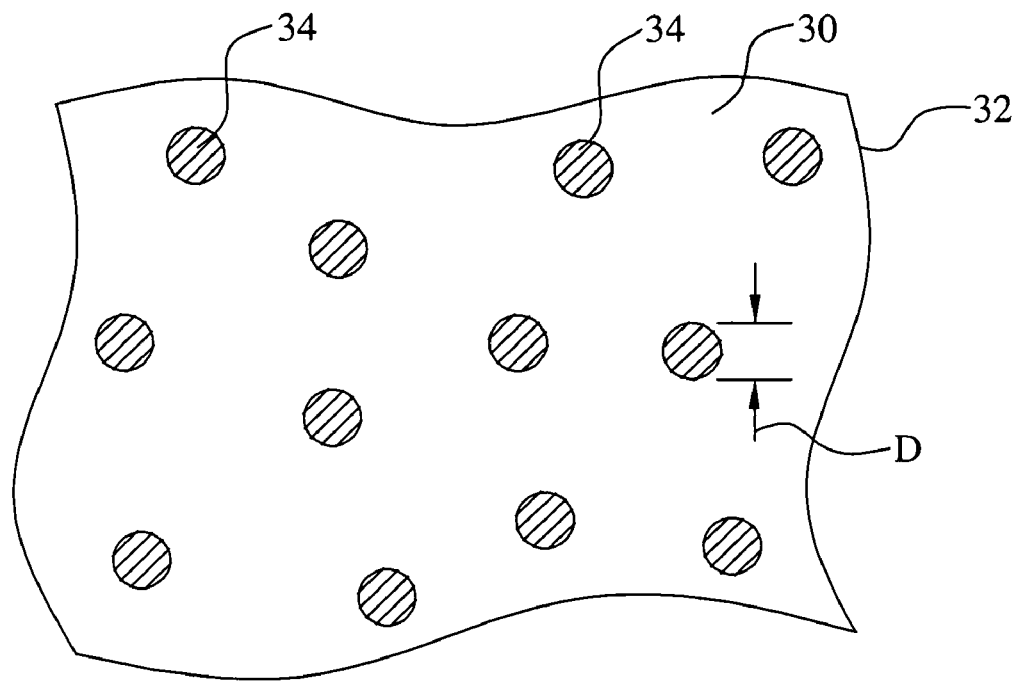
FIG. 2 illustrates a first preferred embodiment of a conductive loaded resin-based material wherein the conductive materials comprise a powder.

The conductive loaded resin-based material of the present invention typically comprises a micron powder(s) of conductor particles and/or in combination of micron fiber(s) substantially homogenized within a base resin host. FIG. 2 shows cross section view of an example of conductor loaded resin-based material 32 having powder of conductor particles 34 in a base resin host 30. In this example the diameter D of the conductor particles 34 in the powder is between about 3 and 12 microns.

Figure 3:
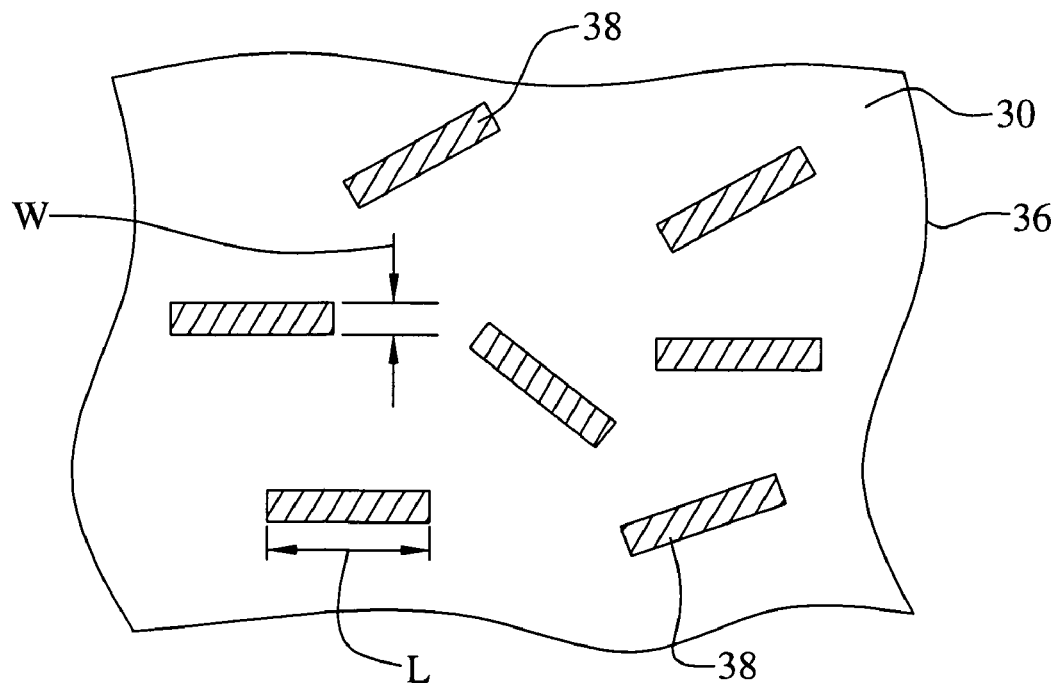
FIG. 3 illustrates a second preferred embodiment of a conductive loaded resin-based material wherein the conductive materials comprise micron conductive fibers.
Figure 4:
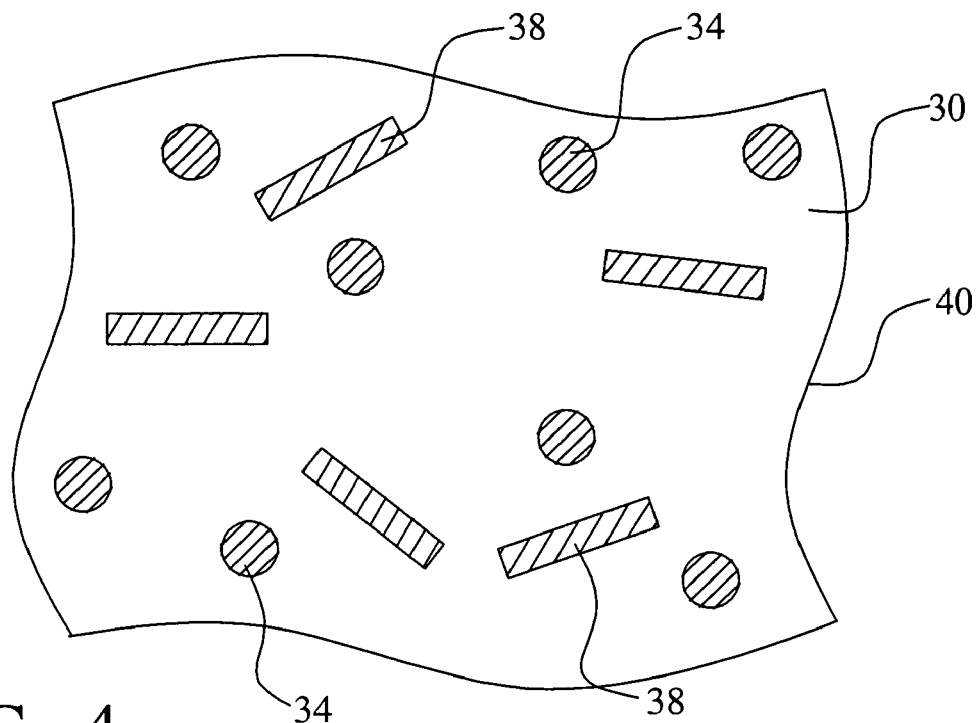
FIG. 4 illustrates a third preferred embodiment of a conductive loaded resin-based material wherein the conductive materials comprise both conductive powder and micron conductive fibers.

FIG. 3 shows a cross section view of an example of conductor loaded resin-based material 36 having conductor fibers 38 in a base resin host 30. The conductor fibers 38 have a diameter of between about 3 and 12 microns, typically in the range of 10 microns or between about 8 and 12 microns, and a length of between about 2 and 14 millimeters. The conductors used for these conductor particles 34 or conductor fibers 38 can be stainless steel, nickel, copper, silver, aluminum, or other suitable metals or conductive fibers, or combinations thereof. These conductor particles and or fibers are substantially homogenized within a base resin. As previously mentioned, the conductive loaded resin-based materials have a sheet resistance between about 5 and 25 ohms per square, though other values can be achieved by varying the doping parameters and/or resin selection. To realize this sheet resistance the weight of the conductor material comprises between about 20% and about 50% of the total weight of the conductive loaded resin-based material. More preferably, the weight of the conductive material comprises between about 20% and about 40% of the total weight of the conductive loaded resin-based material. More preferably yet, the weight of the conductive material comprises between about 25% and about 35% of the total weight of the conductive loaded resin-based material. Still more preferably yet, the weight of the conductive material comprises about 30% of the total weight of the conductive loaded resin-based material. Stainless Steel Fiber of 6-12 micron in diameter and lengths of 4-6 mm and comprising, by weight, about 30% of the total weight of the conductive loaded resin-based material will produce a very highly conductive parameter, efficient within any EMF spectrum. Referring now to FIG. 4, another preferred embodiment of the present invention is illustrated where the conductive materials comprise a combination of both conductive powders 34 and micron conductive fibers 38 substantially homogenized together within the resin base 30 during a molding process.

Figure 5A:
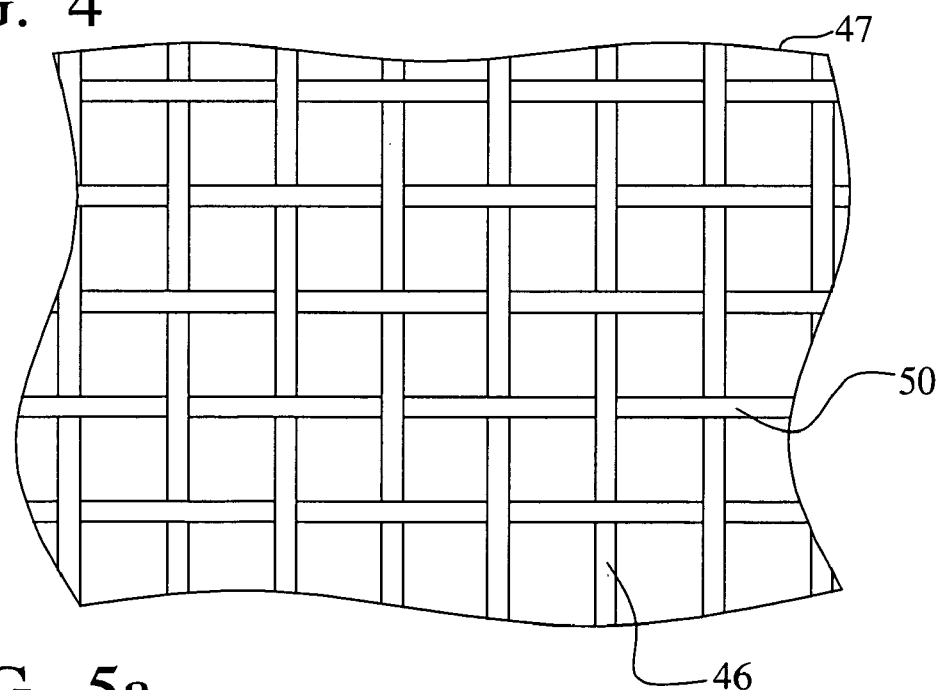

Referring now to FIGS. 5a and 5b, a preferred composition of the conductive loaded, resin-based material is illustrated. The conductive loaded resin-based material can be formed into fibers or textiles that are then woven or webbed into a conductive fabric. The conductive loaded resin-based material is formed in strands that can be woven as shown. FIG. 5a shows a conductive fabric 42 where the fibers are woven together in a two-dimensional weave 46 and 50 of fibers or textiles. FIG. 5b shows a conductive fabric 42' where the fibers are formed in a webbed arrangement. In the webbed arrangement, one or more continuous strands of the conductive fiber are nested in a random fashion. The resulting conductive fabrics or textiles 42, see FIG. 5a, and 42', see FIG. 5b, can be made very thin, thick, rigid, flexible or in solid form(s).

Similarly, a conductive, but cloth-like, material can be formed using woven or webbed micron stainless steel fibers, or other micron conductive fibers. These woven or webbed conductive cloths could also be sandwich laminated to one or more layers of materials such as Polyester(s), Teflon(s), Kevlar(s) or any other desired resin-based material(s). This conductive fabric may then be cut into desired shapes and sizes.

Electrical terminals formed from conductive loaded resin-based materials can be formed or molded in a number of different ways including injection molding, extrusion or chemically induced molding or forming. FIG. 6a shows a simplified schematic diagram of an injection mold showing a lower portion 54 and upper portion 58 of the mold 50. Conductive loaded blended resin-based material is injected into the mold cavity 64 through an injection opening 60 and then the substantially homogenized conductive material cures by thermal reaction. The upper portion 58 and lower portion 54 of the mold are then separated or parted and the electrical terminals are removed.

FIG. 6b shows a simplified schematic diagram of an extruder 70 for forming electrical terminals using extrusion. Conductive loaded resin-based material(s) is placed in the hopper 80 of the extrusion unit 74. A piston, screw, press or other means 78 is then used to force the thermally molten or a chemically induced curing conductive loaded resin-based material through an extrusion opening 82 which shapes the thermally molten curing or chemically induced cured conductive loaded resin-based material to the desired shape. The conductive loaded resin-based material is then fully cured by chemical reaction or thermal reaction to a hardened or pliable state and is ready for use. Thermoplastic or thermosetting resin-based materials and associated processes may be used in molding the conductive loaded resin-based articles of the present invention.

The advantages of the present invention may now be summarized. Effective electrical terminals are provided and, more particularly, effective battery terminals and cables are provided. Methods to form electrical terminals, battery terminals, and battery cables of conductive loaded resin-based materials are provided. The characteristics of the electrical terminals can be altered by forming a metal layer or a conductive paint over the conductive loaded resin-based material. Methods to fabricate electrical terminals from a conductive loaded resin-based material incorporating various forms of the material are provided. A method to fabricate electrical terminals from a conductive loaded resin-based material where the material is in the form of a fabric is provided. Electrical terminals having excellent electrical conductivity and excellent resistance to corrosion are achieved.

As shown in the preferred embodiments, the novel methods and devices of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to form a battery device, said method comprising:
    providing a battery storage cell having first and second internal electrodes;
    providing conductive loaded, resin-based material comprising micron conductor fiber in a resin-based host wherein said micron conductive fiber has a diameter of between about 3 μm and about 12 μm and a length of between about 2 mm and about 14 mm;
    molding said conductive loaded, resin-based material into an external terminal; and
    connecting said external terminal to one of said internal electrodes.

2. The method according to claim 1 wherein the percent by weight of said micron conductor fiber is between about 20% and about 40% of the total weight of said conductive loaded resin-based material.

3. The method according to claim 1 wherein said micron conductive fiber is nickel plated carbon fiber, or stainless steel fiber, or copper fiber, or silver fiber or combinations thereof.

4. The method according to claim 1 wherein said micron conductive fiber is stainless steel and wherein the percent by weight of said stainless steel fiber is between about 20% and about 40% of the total weight of said conductive loaded resin-based material.

5. The method according to claim 1 wherein said micron conductive fiber is stainless steel fiber.

6. The method according to claim 1 wherein said conductive materials comprise conductive powder.

7. The method according to claim 1 wherein said conductive loaded, resin-based material further comprises conductive powder.

8. The method according to claim 1 wherein said molding comprises:
    injecting said conductive loaded, resin-based material into a mold;
    curing said conductive loaded, resin-based material; and
    removing said external terminal from said mold.

9. The method according to claim 1 wherein said molding comprises:
    loading said conductive loaded, resin-based material into a chamber;
    extruding said conductive loaded, resin-based material out of said chamber through a shaping outlet; and
    curing said conductive loaded, resin-based material to form said external terminal.

10. The method according to claim 1 further comprising subsequent mechanical processing of said molded conductive loaded, resin-based material.

11. The method according to claim 1 further comprising forming a metal overlying said molded conductive loaded, resin-based material.

12. The method according to claim 1 further comprising forming a conductive paint layer overlying said molded conductive loaded resin-based material.

13. The method according to claim 1 wherein said step of connecting said external terminal to one of said internal electrodes comprises press fitting said external terminal onto said internal electrode.

14. The method according to claim 1 wherein said step of connecting said external terminal to one of said internal electrodes occurs during said step of molding.

* * * * *